United States Patent
Scheytt (10) Patent No.: US 7,423,464 B2
(45) Date of Patent: Sep. 9, 2008

(54) PHASE AND AMPLITUDE MODULATOR

(76) Inventor: Johann-Christoph Scheytt, Brugge 1, Reken (DE) DE-48734

( * ) Notice: Subject to any disclaimer, the term of this patent is extended or adjusted under 35 U.S.C. 154(b) by 0 days.

(21) Appl. No.: 11/695,710

(22) Filed: Apr. 3, 2007

(65) Prior Publication Data

US 2007/0230587 A1 Oct. 4, 2007

Related U.S. Application Data

(63) Continuation-in-part of application No. 11/278,574, filed on Apr. 4, 2006, now Pat. No. 7,319,352.

(51) Int. Cl.
*H03L 7/00* (2006.01)
(52) U.S. Cl. .................. 327/161; 327/153; 327/158
(58) Field of Classification Search ................. 327/147, 327/149, 153, 156, 158, 161, 163
See application file for complete search history.

(56) References Cited

U.S. PATENT DOCUMENTS

| | | | | |
|---|---|---|---|---|
| 3,831,094 A | * | 8/1974 | Stover | 455/108 |
| 4,600,892 A | * | 7/1986 | Wagner et al. | 330/144 |
| 4,873,491 A | | 10/1989 | Wilkins | |
| 5,121,077 A | * | 6/1992 | McGann | 330/149 |
| 5,216,302 A | | 6/1993 | Tanizawa | |
| 5,430,416 A | * | 7/1995 | Black et al. | 332/145 |
| 5,963,071 A | | 10/1999 | Dowlatabadi | |
| 6,219,397 B1 | * | 4/2001 | Park | 375/376 |
| 6,937,668 B2 | * | 8/2005 | Sridharan et al. | 375/296 |
| 6,952,124 B2 | * | 10/2005 | Pham | 327/156 |
| 6,961,400 B1 | * | 11/2005 | Huff et al. | 375/376 |
| 7,145,373 B2 | * | 12/2006 | Jaussi et al. | 327/158 |
| 7,157,949 B2 | * | 1/2007 | Chen et al. | 327/158 |
| 7,319,352 B2 | * | 1/2008 | Scheytt | 327/161 |
| 2001/0005154 A1 | | 6/2001 | Johnson | |

FOREIGN PATENT DOCUMENTS

DE 19930167 1/2001

* cited by examiner

*Primary Examiner*—N. Drew Richards
*Assistant Examiner*—Hai L. Nguyen
(74) *Attorney, Agent, or Firm*—Rankin, Hill & Clark LLP (57) ABSTRACT

The invention relates to an apparatus for precise modulation of signal phase and signal delay, respectively, and signal amplitude, comprising a first fixed-delay device having its input coupled to an input signal, a first variable delay device having its input coupled to said input signal and having a control input for delay adjustment, a first amplitude control device in series with the first variable delay device, providing at its output an amplitude controlled signal and having a control input for adjusting the output amplitude, a phase detector with linear characteristic having its two inputs connected to the output of the fixed-delay device and the output of the first amplitude control device, an error measurement device having its negative input connected to the output of the phase detector and its positive input connected to a control signal, an amplifier with low-pass characteristic having its input connected to the output of the error measurement device and its output to the control input of the first variable delay device.

5 Claims, 11 Drawing Sheets

PHASE AND AMPLITUDE MODULATOR

The invention relates to a phase and amplitude modulator. It is especially suited for implementation in electronic integrated circuits and allows precise adjustment of phase and amplitude independent of process, voltage, and temperature variances. Depending on the embodiment amplitude and phase can be controlled by analog or digital signals. Also depending on the embodiment the phase and amplitude modulator can be used as a precise variable delay. Another application is the linearization of power amplifiers in wireless transmitter.

In many technical areas devices for phase and amplitude modulation as well as for precise variable signal delay are needed. Applications for phase and amplitude modulators are modulators for wireless or wireline communication systems or radar. Applications for precise variable delays are delay circuits for the synchronisation of receive signals in communications systems, generation of signals with precise mutual signal delay, such as quadrature signals, and the stabilization of signal delays against process, voltage, and temperature variances.

In wireless communication systems amplitude- and phase-modulation techniques are used for transmission of lower frequency signals over high-frequency bands. Among the multitude of modulation schemes combined phase- and amplitude modulation schemes are particularly interesting because they allow to transmit data with a high bit-to-bandwidth density.

Figure 1:
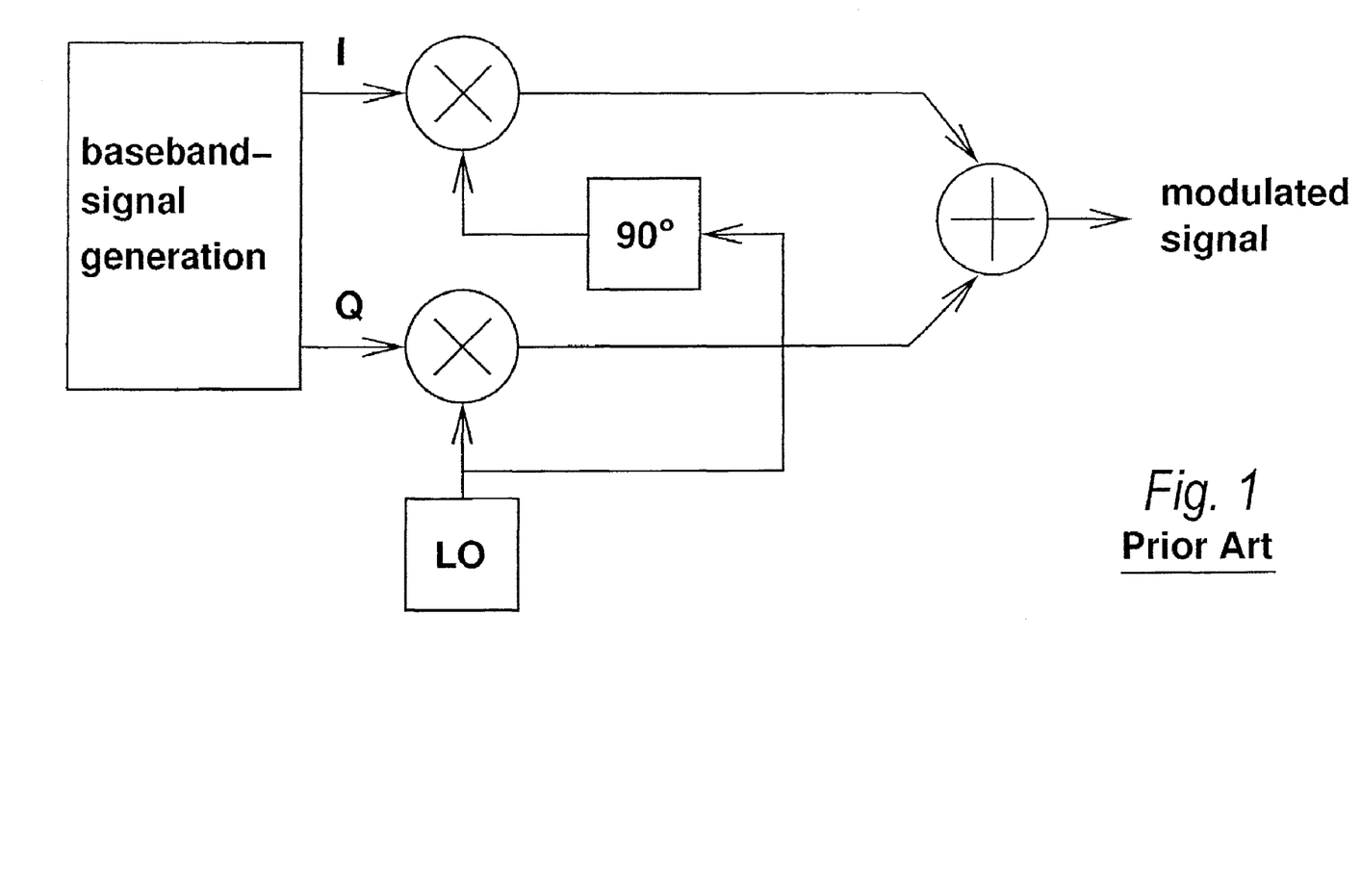
FIG. 1 illustrates the QAM technique (state of the art)

A typical modulation technique is the single-sideband modulation (SSB) technique which is shown in FIG. 1. It uses mixers and complex baseband signals in conjunction with in-phase and quadrature local oscillator signals in order to generate a modulated signal in an intermediate or transmit frequency band. The SSB technique can be used for phase, amplitude and combined phase-amplitude modulation. Drawbacks of this technique are that precise phase relationship between in-phase and quadrature signal and accurate analog components for good side-band suppression and precise modulation, as well as complex digital or analog circuitry for the generation of the complex baseband signal are needed.

If the SSB modulator is used to drive a power amplifier a highly linear amplifier is required, such as class-A or class-AB power amplifiers. These power amplifiers have poor energy-efficiency which is a major disadvantage in battery-powered wireless transmitter.

Figure 2:
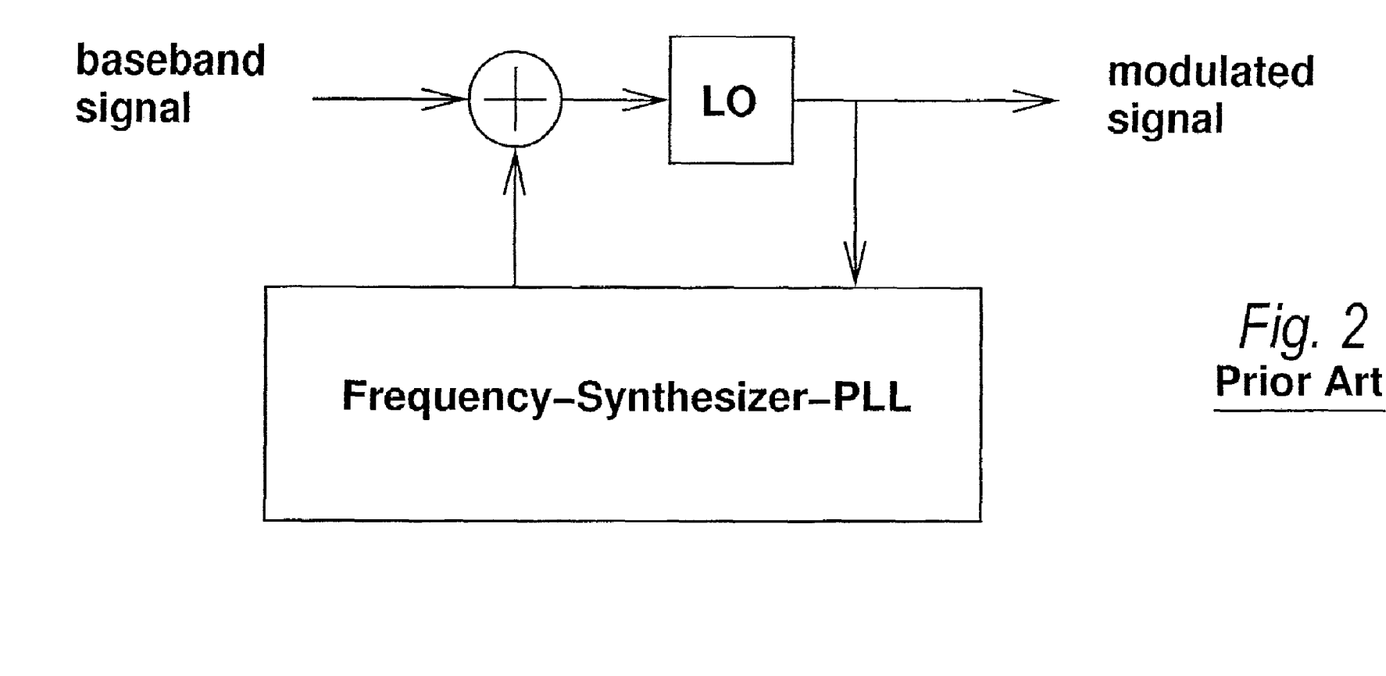
FIG. 2 illustrates the direct local oscillator modulation technique (state of the art)

FIG. 2 shows another modulation technique where the modulated signal is generated by direct modulation of the local oscillator frequency tuning input. This technique is applicable to FM (FM, frequency modulation) and PM (PM, phase modulation). Since the local oscillator frequency is usually controlled by a Synthesizer-PLL (PLL, Phase-Locked Loop), low-frequency modulation of the control voltage of the VCO (VCO, Voltage-Controlled Oscillator) is totally or in part cancelled by the PLL causing the phase modulation to be inaccurate. This can be circumvented by making the PLL loop bandwidth much smaller than the lower corner frequency of the modulation signal spectrum. A drawback is that modulation takes place inside the PLL loop which restricts PLL parameter range. In addition modulation at the sensitive control input of the local oscillator can deteriorate phase noise performance of the local oscillator. Another drawback is that no amplitude modulation is feasible and that some sort of calibration is needed because the VCO tuning characteristic depends on PVT (PVT, Process, Voltage, Temperature) variances.

Figure 3:
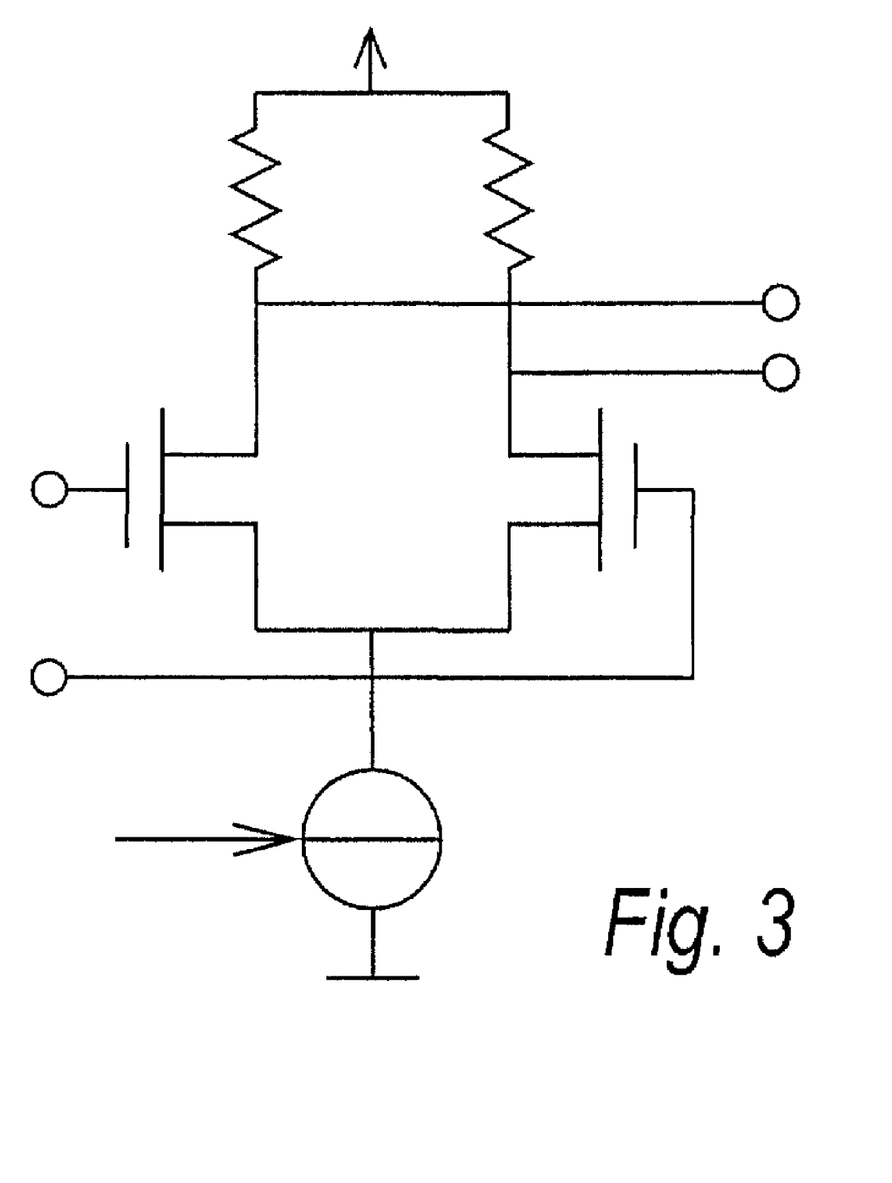
FIG. 3 illustrates the realization of an amplitude control device (state of the art)

In principle it is also possible to modulate amplitude of the local oscillator signal in the modulation scheme according to FIG. 2 outside of the PLL by means of an amplitude control device. FIG. 3 shows a potential realization of an amplitude control device for electronic integrated circuits by means of a differential amplifier with adjustable bias current. The signal for bias current adjustment can be of analog nature or, if an analog-to-digital-converter with a current output is used, of digital nature. A major drawback of such an amplitude control device is that phase shift of the output signal depends on bias current, i.e. on the amplitude of the output signal. This leads to inaccurate phase modulation.

If direct modulation of the VCO in the PLL is used to drive a power amplifier a highly linear power amplifier is required which is a disadvantage in battery-powered wireless transmitter.

Another technique for precise amplitude and phase modulation which is especially useful in combination with highly-efficient power amplifiers is the Polar Loop Transmitter which was first patented in U.S. Pat. No. 4,481,672. In this apparatus phase rsp. amplitude of a transmitter signal are precisely adjusted by means of a PLL rsp. an Amplitude Correction Loop (ACL). Phase modulation is controlled by applying a phase-modulated IF signal to the phase frequency detector of the PLL. The PLL follows the phase-modulated signal precisely by modulating the VCO control voltage in such a way that the phase difference at the phase detector input is adjusted to zero degree thus compensating all non-linearities of the components in the PLL. The power amplifier of the wireless transmitter is included in the PLL loop together with an attenuator, which attenuates the strong power amplifier output signal. Including the power amplifier in the PLL loop allows to effectively linearize non-linearities and PVT variances of the power amplifier phase. Precise amplitude modulation is achieved by the ACL which compares the amplitude of the IF signal with the attenuated output amplitude of the power amplifier and adjusts the amplitude at the input of the power amplifier so that the attenuated power amplifier output amplitude matches the amplitude of the IF signal.

The Polar Loop Transmitter technique has been successfully used in integrated wireless transmitter circuits. Its advantages are that a it can be used to linearize non-linear power amplifiers such as class-C power amplifiers which are highly energy-efficient in comparison to linear amplifiers. In addition it is insensitive to PVT tolerances and no external filtering of RF signals is needed because the PLL provides for narrow-band filtering. A disadvantage is the considerable circuit complexity.

In conclusion it can be stated that phase- and amplitude modulators using SSB technique suffer from high circuit complexity and require accurate local oscillator in-phase and quadrature signals. If direct modulation of the local oscillator is used, PLL parameter range is limited and potentially noise performance of the local oscillator is deteriorated. In addition for accurate modulation calibration is required due to PVT variances of the local oscillator tuning characteristic. Modulating the amplitude by means of an amplitude control device also adds to phase inaccuracy. Furthermore if such modulators are used in wireless transmitters they require linear power amplifiers.

The Polar Loop Transmitter allows to use power-efficient non-linear power amplifiers, is PVT insensitive, and can be fully-integrated. However it requires complex circuitry.

Therefore it is an object of the present invention to provide a phase- and amplitude modulator with reduced complexity and precise phase- and amplitude control independent from PVT variances. In addition a modulation technique that avoids direct modulation at the local oscillator control input inside the Synthesizer-PLL is also required and calibration should be avoided. If used in conjunction with a power amplifier, it should allow the linearization of highly-efficient non-linear power amplifiers.

The above object is achieved by an apparatus for precise modulation of signal phase and signal delay, respectively, and signal amplitude, comprising:

a first fixed-delay device having its input coupled to an input signal, a first variable delay device having its input coupled to said input signal and having a control input for delay adjustment, a first amplitude control device in series with the first variable delay device, providing at its output an amplitude controlled signal and having a control input for adjusting the output amplitude, a phase detector with linear characteristic having its two inputs connected to the output of the fixed-delay device and the output of the first amplitude control device, an error measurement device having its negative input connected to the output of the phase detector and its positive input connected to a control signal, an amplifier with low-pass characteristic having its input connected to the output of the error measurement device and its output to the control input of the first variable delay device.

According to another embodiment of the apparatus according to the present invention described above, the error measurement device is a subtractor and the amplifier with low-pass characteristic comprises an amplifier having its input connected to the output of the subtractor and a low-pass filter having its input connected to the output of the amplifier and its output to the control input of the first variable delay device.

According to an alternative embodiment of the apparatus according to the present invention, the error measurement device is a comparator and the amplifier with low-pass characteristic comprises an up-down-counter and a first digital-to-analog-converter, wherein the comparator's negative input is coupled to the output of the phase detector, its positive input is coupled to the control signal, and its output is coupled to the up-down-control input of the counter, wherein the counter's clock input is coupled to a clock signal and the counter's output is coupled to the input of the first digital-to-analog-converter which is connected to the control input of the first variable delay device.

According to another embodiment of the apparatus according to the present invention described in the above paragraphs, a second digital-to-analog-converter provides a control signal to the positive input of the error measurement device, e.g. to the subtractor.

According to another embodiment of the apparatus according to the present invention described in the above paragraphs, having an amplitude control loop comprising an amplitude detector, a subtractor, and an amplifier with low-pass characteristic, wherein the amplitude detector is connected at its input to the output of the amplitude control device and at its output to a first input of the subtractor wherein the subtractor's second input is connected to a reference amplitude signal and the subtractor's output is connected to the amplifier with low-pass characteristic which is connected to the amplitude control input of the amplitude control device.

According to another embodiment of the apparatus according to the present invention described in the above paragraphs, which represents a wireless transmitter with linearized phase, wherein the first amplitude control device is replaced by a power amplifier having a signal input, an amplitude control input and a signal output, wherein the power amplifier output is connected to the input port of a coupling device having one input and two output ports, wherein the first output of the coupling device is connected to an input of the phase detector and the second output of the coupling device is connected to an antenna, and wherein the coupling device may comprise an attenuator connected to the first output. Alternatively, this attenuator may be placed outside the coupling device. Alternatively the attenuator may be followed by a limiting amplifier to keep the signal amplitude at the phase detector input constant.

According to the wireless transmitter with linearized phase, having an amplitude control loop comprising an amplitude detector, a subtractor, and an amplifier with low-pass characteristic, wherein the amplitude detector is connected at its input to the first output of coupling device and at its output to a first input of the subtractor wherein the subtractor's second input is connected to a reference amplitude signal and the subtractor's output is connected to the amplifier with low-pass characteristic which is connected to the amplitude control input of the power amplifier.

According to another embodiment of the apparatus according to the present invention described in the above paragraphs, the apparatus comprises:

a plurality of further variable delay devices which have a plurality of input signals and are identical in construction with the first variable delay element, wherein the control inputs of said further variable delays are coupled to the same signal as the control input of the first variable delay device, and wherein the plurality of input signals can be of non-periodic or periodic nature, and a plurality of further amplitude control devices which have a plurality of output signals and are identical in construction with the first amplitude control device, wherein each device of said plurality of variable delay devices provides an input signal to one device of said plurality of amplitude control devices and wherein the control inputs of said amplitude control devices are coupled to the same control signal as the control input of the first amplitude control device.

According to another embodiment of the apparatus according to the present invention described in the above paragraphs, the error measurement device is a subtractor with one positive and multiple negative inputs, wherein a plurality of serially coupled elements is used each element consisting of an input which is coupled to a variable delay device and a fixed-delay device, an amplitude control device which is serially connected to the variable delay device, a phase detector which is coupled at its inputs to the output of the fixed-delay device and the amplitude control device, wherein the elements of said plurality elements are serially coupled in such a way that the output of an amplitude control device of one element is coupled to the input of a variable delay device of another element, wherein the first element of said plurality of serially coupled elements is coupled at its input to the output of the first amplitude control device, wherein the outputs of the phase detectors in said plurality of serially coupled elements are coupled to the negative inputs of the subtractor, wherein all variable delay devices in said plurality of serially coupled elements are identical in construction with the first variable delay device and are connected at their control inputs to the same signal as the control input of the first variable delay device, wherein all fixed-delay devices in said plurality of serially coupled elements are identical in construction with the first fixed-delay device, wherein all amplitude control devices in said plurality of serially coupled elements are identical in construction with the first amplitude control device and are coupled at their control inputs to the same signal as the control input of the first amplitude control device.

The invention is explained in greater detail hereinafter on the basis of preferred embodiments with reference to the enclosed drawings, in which.

Figure 4:
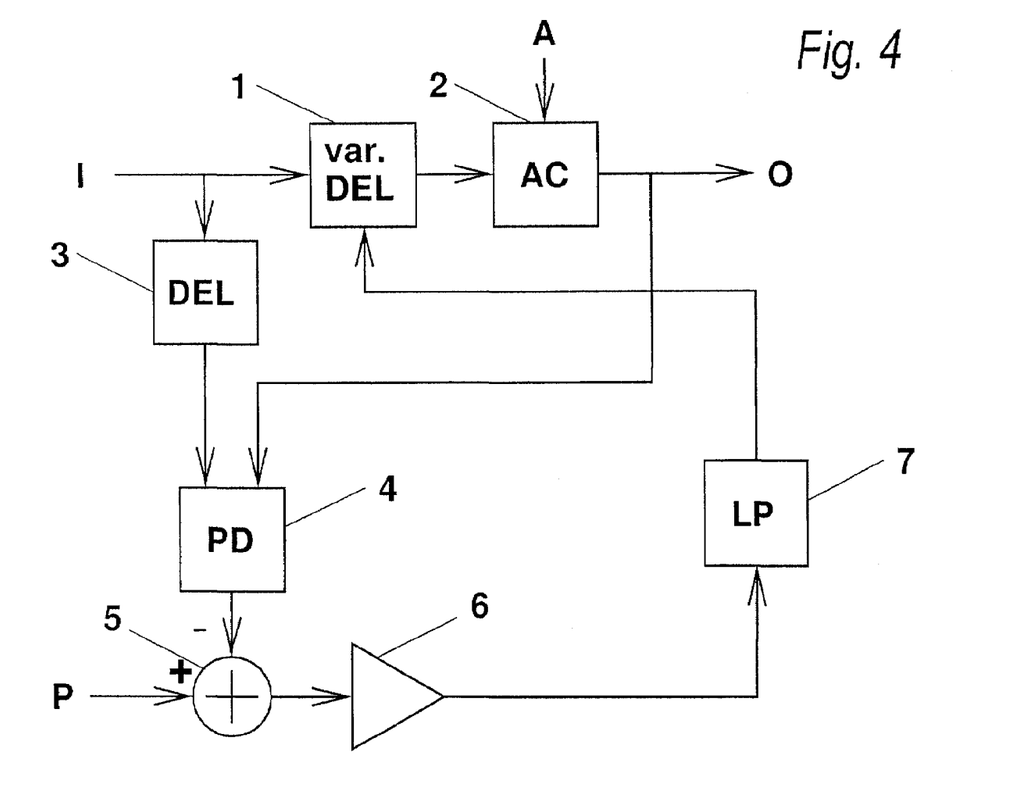
FIG. 4 illustrates an embodiment of the present invention.
Figure 10:
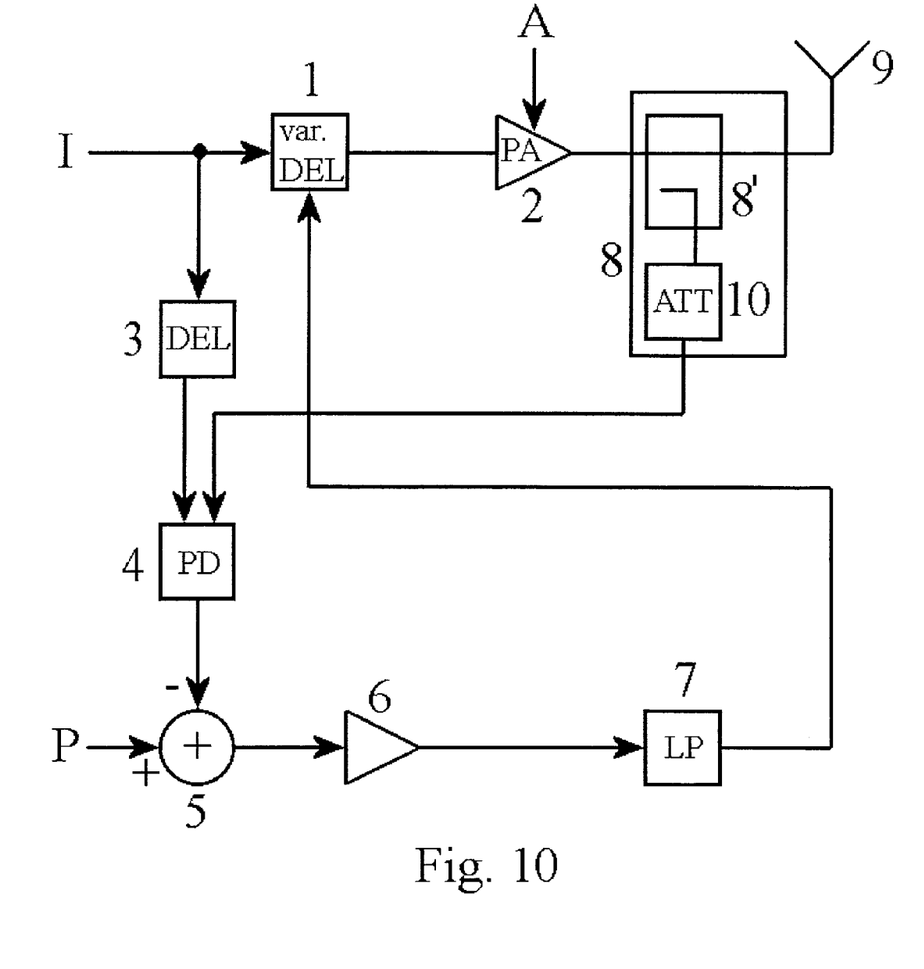
Figure 11:
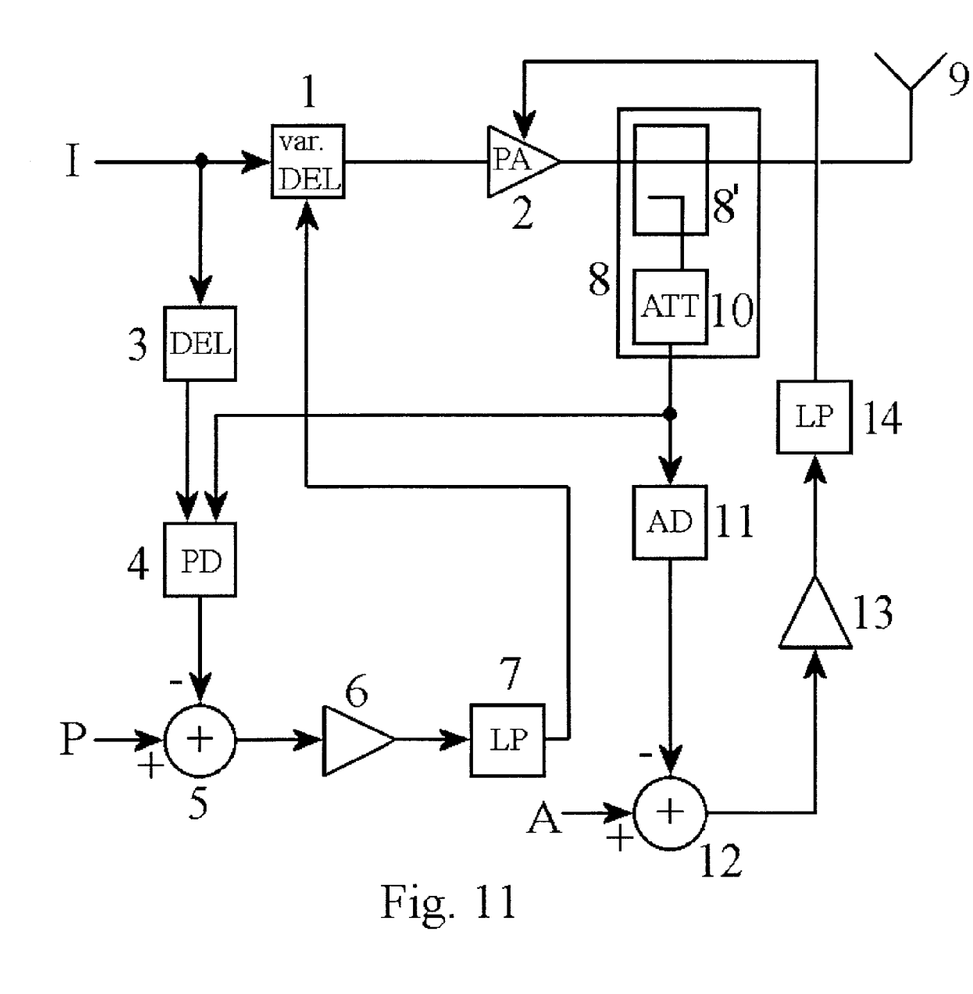

FIG. 10 illustrates a preferred embodiment for power amplifier phase linearization FIG. 11 illustrates a preferred embodiment for power amplifier phase and amplitude linearization A preferred embodiment of the apparatus according to the present invention is shown in FIG. 4. An input signal I, e.g. from a local oscillator, is fed to a variable delay device (1) and a fixed-delay device (3). An amplitude control device (2) with control input A for amplitude control is connected in series with the variable delay (1) and provides an output signal O. The output signal O and the output signal of the fixed-delay device (3) are fed to a linear phase detector (4). The output of the linear phase detector (4) is fed to the negative input of a subtractor (5). The positive input of the subtractor (5) is coupled to a phase control signal P. The output of the subtractor (5) is coupled to the input of an amplifier (6) with high gain which provides a signal to the low-pass filter (7). The output of the low-pass filter (7) is coupled to the control input of the variable delay device (1).

The circuit according to FIG. 4 operates as follows. Phase rsp. amplitude of the incoming signal I are modulated by means of the variable delay device (1) rsp. the amplitude control device (2). The input signal I is also fed to a fixed-delay device (3). For the explanation of the basic circuit principle at this point it is assumed that the delay of the fixed-delay device (3) is zero. In this case the linear phase detector (4) directly measures the delay rsp. phase shift between signals I and O and provides precise phase information. Since the phase detector output is connected to the negative input of the subtractor (5), the open loop gain of the control loop is negative resulting in a negative feedback system. If the amplifier (6) exhibits sufficiently high gain, the difference between phase control signal P and phase detector output at the subtractor input is driven to zero. The low-pass filter (7) is added to ensure loop stability and suppress noise.

Figure 5:
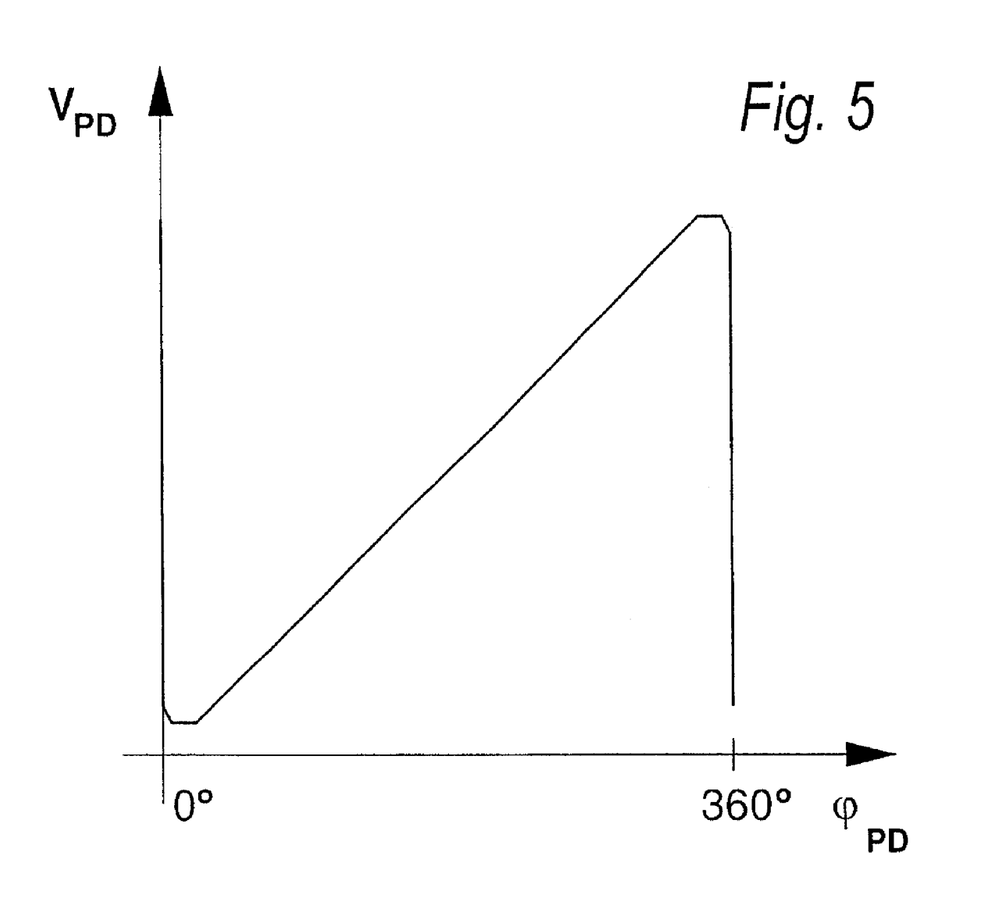
FIG. 5 illustrates an example of a linear phase detector characteristic.
Figure 6:
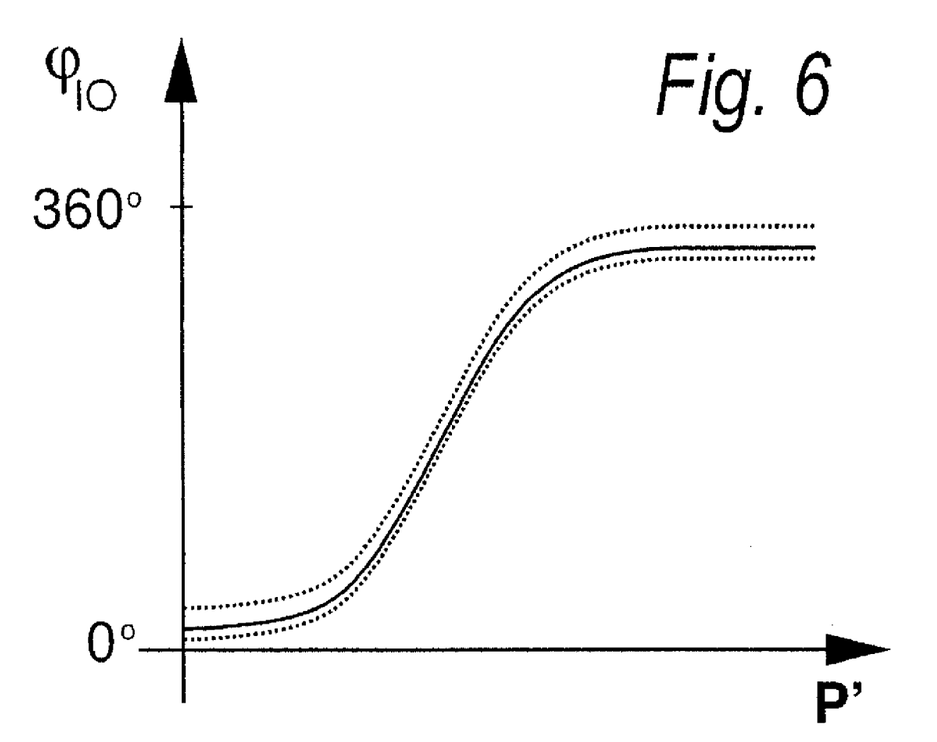
FIG. 6 illustrates an example of a non-linear variable delay characteristic.
Figure 7:
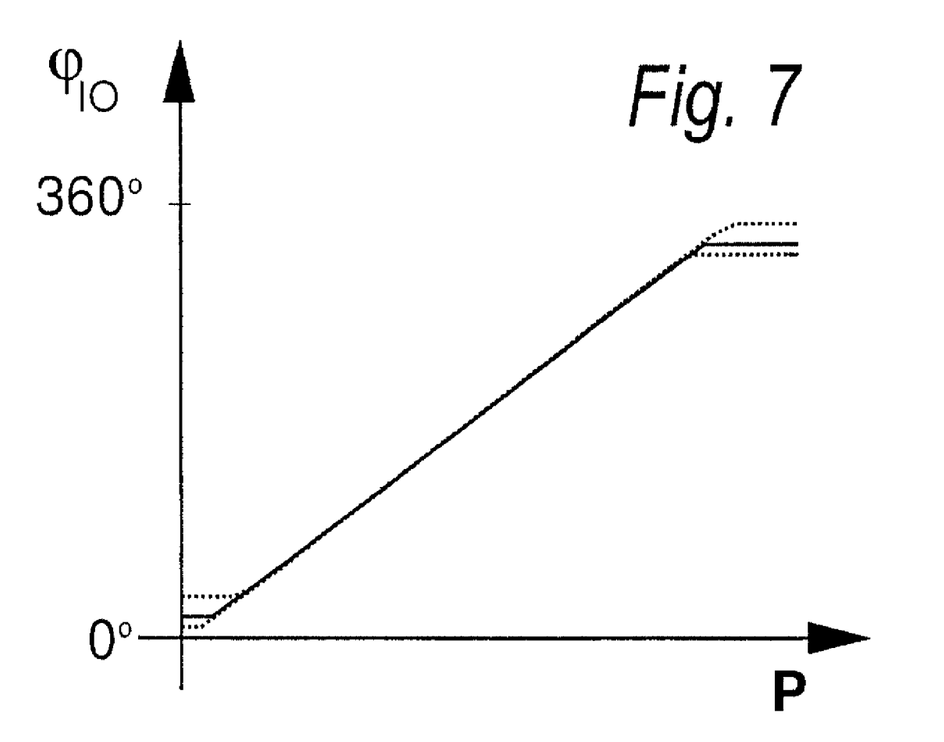
FIG. 7 illustrates an overall phase tuning characteristic according to an embodiment of the present invention.

For further explanation of the operational principle and advantages the tuning characteristics of the circuit elements in FIG. 4 are used. Let $j_{IO}$ denote the phaseshift of signal O relative to periodic signal I. Again the delay rsp. phase shift of the fixed-delay device (3) is assumed to be zero. It is also assumed that within an interval of 0 to 360 degree the phase detector (4) exhibits a precise linear characteristic according to FIG. 5 whereas $V_{PD}$ denotes the averaged phase detector output voltage. A typical non-linear tuning characteristic $j_{IO}$ (P') of an integrated electronic version of the variable delay (1) might be looking like the solid line in FIG. 6 whereas P' is the delay tuning signal. The dashed lines show the tuning characteristic with additional phase shift for different values of the amplitude control signal A. Under the assumption that the amplifier (6) has sufficient gain the resulting overall tuning characteristic $j_{IO}$(P) can be depicted as in FIG. 7 whereas P is the phase control signal at the positive input of the subtractor in FIG. 4. As can be seen in FIG. 7 the overall tuning characteristic is solely determined by the characteristic of the linear phase detector (4) which allows to linearize non-linear tuning characteristic of the variable delay (1) as well as compensate phase shift variations of the amplitude control device (2).

Linear phase detectors have a linear characteristic between −180 to +180 degree, −90 to +90 degree, 0 to 180 degree, or 0 to 360 degree depending on the implementation. At the minimum and maximum value of the phase detector linear region linearity is deteriorated e.g. due to limited switching speed of logic gates in the case of a digital phase detector. Since a delay can only produce positive delays rsp. phase shifts, the fixed-delay (3) in FIG. 4 can be used to extend the range of phase difference seen at the phase detector input to negative values. For phase detectors with a characteristic which is symmetric to 0 degree the phase difference range is extended to negative values which extends the linear range of the circuit according to FIG. 4.

Variable delay realizations in integrated circuits such as e.g. a capacitively loaded inverter in CMOS (CMOS, Complementary Metal-Oxide Semiconductor) technology typically exhibits delay variations of over +−25% over PVT variances and non-linear tuning characteristic. An advantage of the invention according to claim 1 is therefore that delay tolerances are cancelled out and non-linear tuning characteristics can be linearized.

In contrast to inaccurate and non-linear delays, precise linear phase detectors are available in integrated microelectronic circuits in the form of digital phase detectors. A digital phase detector is a phase detector which uses digital devices such as logic gates and flip-flops. There are many different possibilities to realize digital phase detectors with linear characteristic [cf. Roland E. Best: "Phase-Locked Loops", McGraw-Hill Professional Publishing, June 2003]. A simple example is an exclusive-or gate of which the averaged output voltage can be used for phase detection. The averaged output voltage of this phase detector depends only on phase shift of the input signals, switching speed of the transistors, and the supply voltage. In modern CMOS technologies sufficiently high switching speed can be guaranteed up to high phase detector input frequencies which ensures very good linearity.

The use of linear phase detection for phase rsp. delay control in the circuit according to FIG. 4 allows to use simple variable delay circuits for integrated circuits with poor accuracy and linearity as well as amplitude control devices with inaccurate phase without sacrificing high linearity and precision. At the same time the linear digital phase detector is a very simple digital device. Therefore the invention according to FIG. 4 has the advantage that at the same time circuit complexity is reduced and accuracy improved.

In comparison to the QAM technique the invention has the advantage that circuit complexity and accuracy requirements of analog components are greatly reduced. In addition no in-phase and quadrature signal, mixers or complex baseband signal generation circuits are required.

An advantage in comparison to direct modulation of the local oscillator in the synthesizer-PLL is that modulation takes place outside of the PLL and that the local oscillator frequency is not modulated. Hence PLL bandwidth is not limited by the low frequency content of the modulation signal spectrum and can be chosen with regard to other optimization criteria. Further oscillator phase noise can't be deteriorated due to modulation of the oscillator control input signal.

A preferred embodiment of the invention according to FIG. 4 is the replacement of the subtractor (5), the amplifier (6), and the low-pass filter (7) by a comparator, an up-down-counter, and a digital-to-analog-converter. The positive input of the comparator is coupled to the phase control signal P and the negative input is coupled to the output of the phase detector (4). The up-down control input of the up-down-counter is coupled to the output of the comparator and the clock input of the up-down-counter is coupled to a clock signal. The digital-to-analog-converter is connected to the up-down-counter output and provides at its analog output the control signal P' to the variable delay element (1) in FIG. 4.

Another preferred embodiment of the invention is the use of a digital-to-analog-converter for the generation of the control signal P in FIG. 4. By this means phase can be controlled with a digital control word enabling digital phase modulation schemes.

Since the output of a digital phase detector in CMOS technology switches between supply voltage and ground, the averaged output voltage of a digital phase detector is proportional to the average supply voltage value. Another preferred embodiment of the invention is therefore to make the phase control signal P from FIG. 4 in the same way dependent from supply voltage as the digital phase detector output voltage. By this means it is possible to make the overall tuning characteristic $j_{LO}(P)$ of the circuit according to FIG. 4 independent of supply variations. One practical way to do this is by means of a digital-to-analog converter which generates the phase control signal P and uses the supply voltage as reference voltage. In this case the digital-to-analog-converter might be providing a phase control voltage of e.g. (supply voltage)/Z with Z being the value of the digital-to-analog-converter input word. By this means the phase- and amplitude modulator according to FIG. 4 is fully insensitive to PVT variances.

Another preferred embodiment according to the present invention is shown in FIG. 10. An input signal I, e.g. from a local oscillator, is fed to a variable delay device (1) and a fixed-delay device (3). The variable delay device (1) is connected in series with a power amplifier (2) with amplitude control input A for amplitude control and a coupling device (8) having a first output port for outputting a first output signal in response to an output signal of the power amplifier (2) by means of a coupling unit (8') and a second output port for driving an antenna (9). The coupling device (8) may comprise an attenuator (10) for attenuating the first output signal. This attenuator (10) may also be placed outside the coupling device (8). The first output signal of the coupling device (8) and the output signal of the fixed-delay device (3) are fed to a linear phase detector (4). Instead of feeding the first output of the coupling device (8) directly to a linear phase detector (4), the first output signal of the coupling device (8) may be fed to the input of a limiting amplifier with the output signal of said limiting amplifier and the output signal of the fixed-delay device (3) being fed to a linear phase detector (4). The output of the linear phase detector (4) is fed to the negative input of a subtractor (5). The positive input of the subtractor (5) is coupled to a phase control signal P. The output of the subtractor (5) is coupled to the input of an amplifier (6) with high gain which provides a signal to the low-pass filter (7). The output of the low-pass filter (7) is coupled to the control input of the variable delay device (1). This embodiment can be used to precisely modulate the phase of the high-frequency antenna output signal using the phase control signal P. If a non-linear power amplifier with unprecise output phase is used its output phase is corrected and hence linearized.

The preferred embodiment of FIG. 10 can be extended with an amplitude correction loop which is shown in FIG. 11. The amplitude correction loop comprises an amplitude detector (11), a subtractor (12), and an amplifier with high gain and low-pass characteristic (13). The first output of the coupling device (8) is connected to an amplitude detector (11) which is connected to the negative input of the subtractor (12). The positive input of the subtractor (12) is coupled to an amplitude control signal A and the output of the subtractor (12) is connected to the amplifier (13) which provides a signal to the low pass filter (14) for driving the amplitude control input of the power amplifier (2). This embodiment can be used to precisely modulate phase and amplitude of the high-frequency antenna output signal using the phase control signal P and the amplitude control signal A. If a non-linear power amplifier with unprecise output phase and amplitude is used its output phase and amplitude is corrected and hence linearized. The embodiment of FIG. 11 has the advantage of more precise amplitude modulation compared to the embodiment in FIG. 10.

Furthermore, for instance, the explanations and advantages regarding the variable delay device (1), the fixed-delay device (3), the linear phase detector (4), the subtractor (5), the amplifier (6) and the low-pass filter (7) mentioned above with respect to the previous preferred embodiments also hold for the same or similar elements of the preferred embodiments of FIGS. 10 and 11.

The preferred embodiments of FIG. 10 and FIG. 11 can be used for wireless transmitters with phase, amplitude and combined phase-amplitude modulation. In comparison to the SSB modulator no precise in-phase and quadrature oscillator signals are required for good side-band suppression and a non-linear power amplifier can be used. In comparison to the modulation technique from FIG. 2 where the modulated signal is generated by direct modulation of the VCO tuning input inside the PLL no VCO modulation is required which reduces noise, and no cancellation of the modulation from 0 Hz up to maximum modulation frequency takes place if the bandwidths of the control loops in FIG. 10 and FIG. 11 are chosen to be larger than the modulation bandwidth. In comparison to the Polar Loop Transmitter the preferred embodiment of FIG. 11 has the advantage that it does not need a SSB modulator, only a single local oscillator which is in fact a frequency synthesizer, and no mixers at all. Hence compared to the Polar Loop Transmitter the preferred embodiment of FIG. 11 exhibits greatly reduced circuit complexity.

Figure 8:
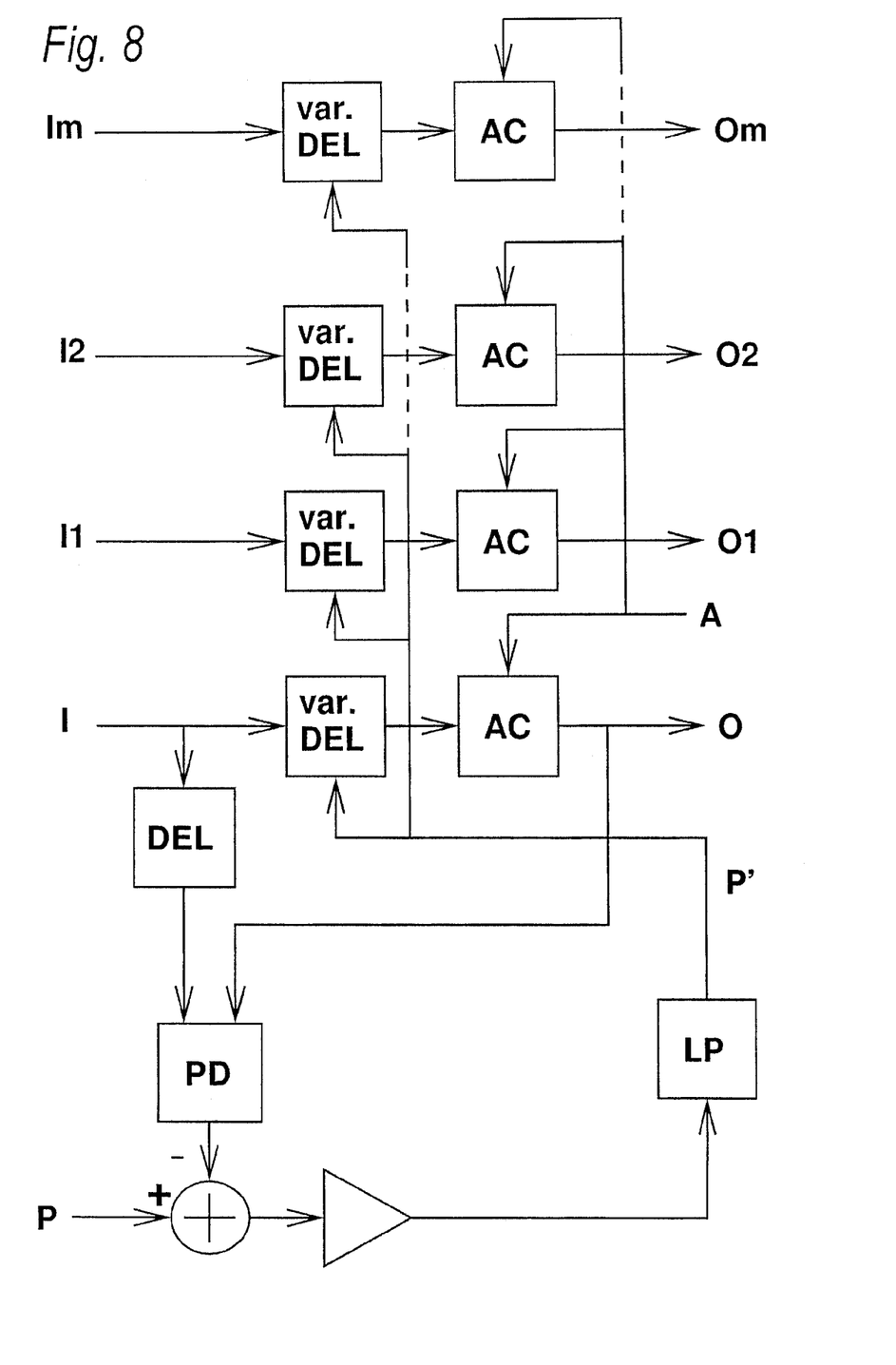
FIG. 8 illustrates a preferred embodiment with parallel branches.

A further preferred embodiment of the invention is shown in FIG. 8. The invention according to FIG. 4 is extended in such a way that one or more parallel branches are added wherein each branch is made of a variable delay in series with an amplitude control device. All variable delays are identical in construction, share the same delay control signal P' but have different input signals. Accordingly all amplitude control devices share the same control signal A, are identical in construction but have different output signals. By this means parallel signals such as digital busses can be precisely delayed with little extra hardware. Advantageously the fixed-delay device should be by-passed or set to a delay of zero.

Figure 9:
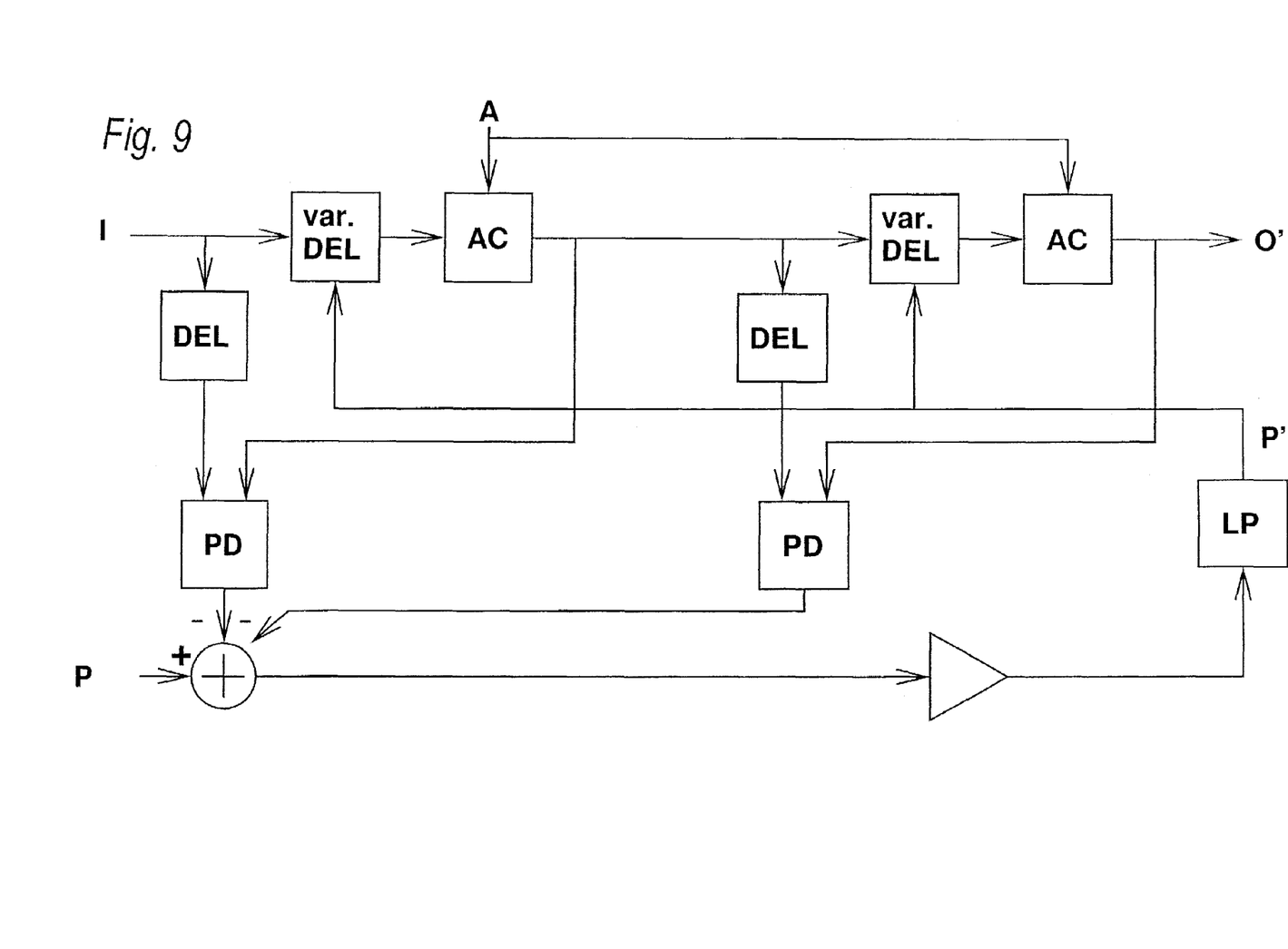
FIG. 9 illustrates a preferred embodiment with an extended phase range.

Another embodiment of the invention is depicted in FIG. 9. The circuit according to FIG. 4 is extended in such a way that one or more branches are added which are serially connected to each other. Each of said branches is made of a variable delay device in series with an amplitude control device and a fixed-delay device with the same input signal as the variable delay device. All fixed-delay devices are identical in construction. All variable delays are identical in construction and share the same delay control signal P'. Accordingly all amplitude control devices share the same control signal A and are identical in construction. Further each branch has a separate phase detector which measures the phase difference between the output of the fixed-delay device and output of the amplitude control device. The subtractor according to the circuit from FIG. 4 is replaced by a subtractor with one positive and multiple negative inputs. All phase detector outputs are coupled to negative inputs of the subtractor and the phase control signal P is connected to the positive input of the subtractor. The circuit according to FIG. 9 has the advantage that phase ranges which extend the linear range of a single phase detector can be accomplished.

The technique in FIG. 9 can also advantageously be used for improving linearity. The linearity of digital phase detectors decreases near the upper and lower limit of the total phase range. For a specified phase shift range the use of multiple phase detectors and serially connected branches allows to reduce the phase shift that is seen by a single phase detector. Hence precision and linearity of phase measurement are improved.

The invention claimed is:

1. An apparatus for precise modulation of signal phase and signal delay, respectively, and signal amplitude, comprising:
    a first fixed-delay device having its input coupled to an input signal,
    a first variable delay device having its input coupled to said input signal and having a control input for delay adjustment,
    an amplitude control device in series with the first variable delay device, providing at its output an amplitude controlled signal and having a control input for adjusting the output amplitude, and wherein said amplified controlled signal is configured to drive an antenna,
    a coupling device having its input coupled to the output of the amplitude control device, comprising a first output for providing a first output signal in response to the amplitude controlled signal at its input,
    a phase detector with linear characteristic having its two inputs connected to the output of the fixed-delay device and the first output of the coupling device,
    a first error measurement device having its negative input connected to the output of the phase detector and its positive input connected to a first control signal,
    a first amplifier with low-pass characteristic having its input connected to the output of the first error measurement device and its output to the control input of the first variable delay device.

2. The apparatus of claim 1, wherein the coupling device comprises an attenuator for attenuating the first output signal provided at the first output.

3. The apparatus of claim 1, wherein the coupling device comprises a second output configured to provide the amplitude controlled signal to the antenna.

4. The apparatus of claim 1, further configured for precise linearization of signal amplitude, comprising:
    an amplitude detection device having its input coupled to said first output of said coupling device,
    a second error measurement device having its negative input connected to an output of the amplitude detection device and its positive input connected to a second control signal,
    a second amplifier with low-pass characteristic having its input connected to an output of the second error measurement device and its output to the control input of the amplitude control device.

5. The apparatus of claim 1, wherein the amplitude control device represents a power amplifier.

* * * * *